United States Patent
Berry, III et al.

(10) Patent No.: US 9,740,104 B2
(45) Date of Patent: Aug. 22, 2017

(54) PLASMA DRY STRIP PRETREATMENT TO ENHANCE ION IMPLANTED RESIST REMOVAL

(71) Applicant: Lam Research Corporation, Fremont, CA (US)

(72) Inventors: Ivan L. Berry, III, San Jose, CA (US); Glen Gilchrist, Danvers, MA (US)

(73) Assignee: Lam Research Corporation, Fremont, CA (US)

(*) Notice: Subject to any disclaimer, the term of this patent is extended or adjusted under 35 U.S.C. 154(b) by 286 days.

(21) Appl. No.: 14/268,455

(22) Filed: May 2, 2014

(65) Prior Publication Data

US 2015/0316857 A1 Nov. 5, 2015

(51) Int. Cl.
| | |
|---|---|
| G03F 7/36 | (2006.01) |
| G03F 7/20 | (2006.01) |
| H01L 21/311 | (2006.01) |
| H01L 21/67 | (2006.01) |
| H01L 21/266 | (2006.01) |

(52) U.S. Cl.
CPC ............ *G03F 7/36* (2013.01); *G03F 7/70341* (2013.01); *G03F 7/70875* (2013.01); *H01L 21/31138* (2013.01); *H01L 21/67115* (2013.01); *H01L 21/67201* (2013.01); *H01L 21/67207* (2013.01); *H01L 21/67248* (2013.01); *H01L 21/266* (2013.01)

(58) Field of Classification Search
CPC ........................................................ G03F 7/40
See application file for complete search history.

(56) References Cited

U.S. PATENT DOCUMENTS

2002/0151156 A1* 10/2002 Hallock .................. G03F 7/42
438/531

* cited by examiner

*Primary Examiner* — Kathleen Duda

(57) ABSTRACT

Systems and methods for processing a substrate include exposing a substrate to UV light from a UV light source having a predetermined wavelength range. The substrate includes a photoresist layer that has been bombarded with ions. The method includes controlling a temperature of the substrate, while exposing the substrate to the UV light, to a temperature less than or equal to a first temperature. The method includes removing the photoresist layer using plasma while maintaining a temperature of the substrate to less than or equal to a strip process temperature after exposing the substrate to the UV light.

11 Claims, 8 Drawing Sheets

PLASMA DRY STRIP PRETREATMENT TO ENHANCE ION IMPLANTED RESIST REMOVAL

FIELD

The present disclosure relates to substrate processing, and more particularly systems and methods for removing photoresist from a substrate after ion implantation.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are used to deposit or remove films on a substrate. During processing, a photoresist layer may be deposited on the substrate. The photoresist layer may then be patterned to define masked and unmasked regions for subsequent ion implantation. During the ion implantation, ions of a material are accelerated in an electrical field and directed at the substrate. The ions are used to change physical, chemical, and/or electrical properties of the substrate. The masked regions of the substrate are used to block the ions. The ions are implanted in an exposed layer of the substrate in the unmasked regions. When the ion implantation steps are complete, the photoresist mask is usually removed before additional processing is performed.

Referring now to FIGS. 1A to 1C, methods for processing a substrate are shown. In FIG. 1A at 20, a photoresist layer is formed on an outer surface of a substrate, for example using spin coating or other suitable methods. At 22, the photoresist layer is patterned into masked and unmasked regions. At 24, the substrate is bombarded with ions. The ions are implanted into the substrate in the unmasked regions of the substrate. The photoresist layer in the masked regions of the substrate blocks the ions. During subsequent processing, the photoresist layer is removed at 26. At 28, further processing of the substrate is performed.

In FIG. 1B, the photoresist layer may be exposed to ultraviolet (UV) light at 30 to cross-link the photoresist. Exposure to the UV light is performed prior to bombardment with ions at 24.

In FIG. 1C, a method for removing the photoresist layer after ion bombardment is shown. At 34, the substrate is arranged in a processing station. At 36, the substrate is heated to a predetermined temperature. In some examples, the substrate is heated to a temperature of 285° C. At 38, process gases are supplied to the processing station, plasma is supplied or struck, and the plasma strips the photoresist.

High ion implant doses (greater than about $1\times10^{15}$ ions/$cm^2$) into the masked regions of the photoresist layer may generate a hard carbonaceous crust layer on an outermost surface of the photoresist layer. In some examples, the crust layer has a thickness of approximately 700 Angstroms. In addition, the ion implantation process breaks down the underlying photoresist into smaller and more volatile fractions by a chain scission mechanism and by a photoresist deprotection reaction caused by photoacid being generated by the ion implantation process.

Removal of the crust layer using plasma requires elevated temperatures due to a high activation energy of the crust layer/plasma reaction (1.6-2.6 eV). However, the implanted photoresist has a propensity to explode or pop when heated due to gas pressure being released by fractionated photoresist under the crust layer. The popping creates defects and causes line breaks. Some methods reduce the strip process temperature below a temperature at which popping occurs. However, these lower temperatures also significantly reduce the ash rate and throughput.

As shown in FIG. 1B, exposing the substrate to ultraviolet (UV) light has been used prior to ion implantation to crosslink the photoresist layer. This approach makes the substrate less prone to popping but the UV exposure causes critical dimension (CD) loss. Additionally with the advent of chemically amplified photoresists, the UV exposure also generates photoacids, which when heated cause the deprotection reaction and generate the unwanted volatile compounds the UV exposure was designed to inhibit.

SUMMARY

A method for processing a substrate includes exposing a substrate to UV light from a UV light source having a predetermined wavelength range. The substrate includes a photoresist layer that has been bombarded with ions. The method includes controlling a temperature of the substrate, while exposing the substrate to the UV light, to a temperature less than or equal to a first temperature. The method includes removing the photoresist layer using plasma while maintaining a temperature of the substrate to less than or equal to a strip process temperature after exposing the substrate to the UV light.

In other features, the first temperature is less than or equal to a thermal activation threshold for initiating a deprotection reaction. The first temperature is less than or equal to 75° C. The first temperature is less than or equal to 50° C.

In other features, the substrate has an untreated popping temperature before exposing the substrate to the UV light. The substrate has a UV-treated popping temperature after exposing the substrate to the UV light. The UV-treated popping temperature is greater than the untreated popping temperature. The strip process temperature is set greater than or equal to the untreated popping temperature and less than or equal to the UV-treated popping temperature. The strip temperature is greater than or equal to the untreated popping temperature and 10 to 40° C. less than the UV-treated popping temperature.

In other features, the predetermined wavelength range is between 172-245 nm. Dosing of the ions in the substrate is greater than about $1\times10^{15}$ ions/$cm^2$. The method includes flowing purge gas while exposing the substrate to the UV light.

A substrate processing system to process a substrate includes a first processing station including a UV light source to expose a substrate to UV light having a predetermined wavelength range. The substrate includes a photoresist layer that has been bombarded with ions. A first substrate support supports the substrate and controls a temperature of a substrate, during exposure to the UV light, to a temperature less than or equal to a first temperature. A second processing station includes a second substrate support to support the substrate and to control a temperature of the substrate to a strip process temperature during photoresist stripping. A process gas supply supplies process gases to the processing station during the photoresist stripping. A plasma generator to generate plasma in the processing station during the photoresist stripping.

In other features, the first substrate support controls the temperature of the substrate during exposure to the UV light to less than or equal to a thermal activation threshold for initiating a deprotection reaction. The first temperature is less than or equal to 75° C. The first temperature is less than or equal to 50° C.

In other features, the substrate has an untreated popping temperature before the exposure. The substrate has a UV-treated popping temperature after the exposure. The UV-treated popping temperature is greater than the untreated popping temperature. The second substrate support controls the temperature of the substrate during the photoresist stripping to greater than or equal to the untreated popping temperature and less than or equal to the UV-treated popping temperature. The second substrate support controls the temperature of the substrate during the photoresist stripping to greater than or equal to the untreated popping temperature and 10 to 40° C. less than the UV-treated popping temperature.

In other features, the predetermined wavelength range is between 172-245 nm. Dosing of the ions in the photoresist is greater than about $1\times10^{15}$ ions/cm$^2$. The first processing station flows purge gas during exposure to the UV light.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

According to the present disclosure, the substrate is exposed to UV light after ion implantation and before a photoresist layer is removed. In some examples, the substrates are cooled during exposure to the UV light and are kept below a predetermined strip process temperature during photoresist removal. UV pretreatment according to the present disclosure increases a popping temperature of the substrate relative to substrates that have not been treated with the UV light source. The ability to remove the photoresist at a higher strip process temperature without popping enables increased ash rates and throughput.

Without being bound by theory, it is believed that the ion implantation process itself has already generated the photoacids and deactivated the photoacid generators. The ion generated scissions are more readily crosslinkable by UV excitation. Since the photoresist is being removed anyway, CD loss due to UV exposure is of no concern. However since the photoacid is already present, the photoresist layer may be kept below a thermal activation threshold for the deprotection reaction to commence during UV exposure. In some examples, the UV exposure is carried out below the thermal activation threshold for the deprotection reaction. In some examples, the temperature of the substrate during UV exposure is maintained less than or equal to 75° C. or less than or equal to 50° C., although other temperature values may be used.

The foregoing examples are described in the context of a multi-station sequential processing tool. However, it can be appreciated that the foregoing disclosure is not limited as such. Rather, the present disclosure can be implemented in any substrate processing system including a UV light source and a plasma processing station. For example only, the plasma can be RF plasma generated using an RF source and a matching network or another suitable device, or microwave plasma generated using a plasma tube or another suitable device. The plasma can be created in the processing chamber or remotely.

Figure 1C:
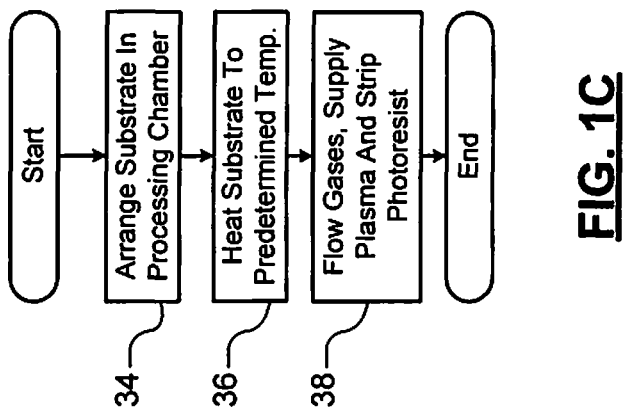
FIG. 1A-1C are flowcharts illustrating examples of methods for processing a substrate using a photoresist layer and ion bombardment and a method for stripping the photoresist according to the prior art.
Figure 1B:
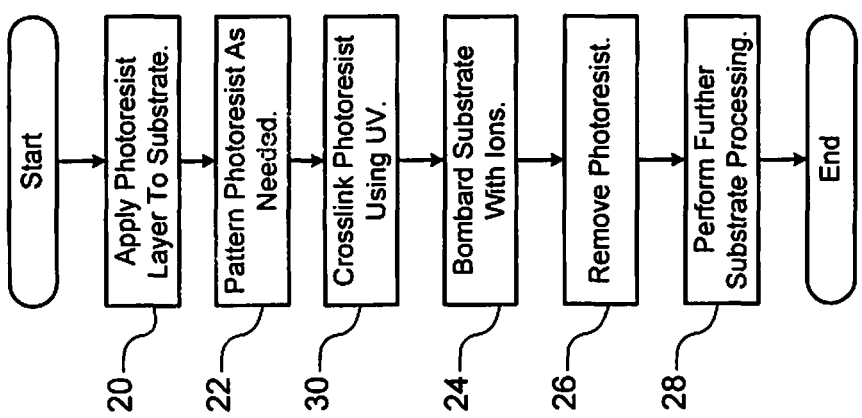
Figure 1A:
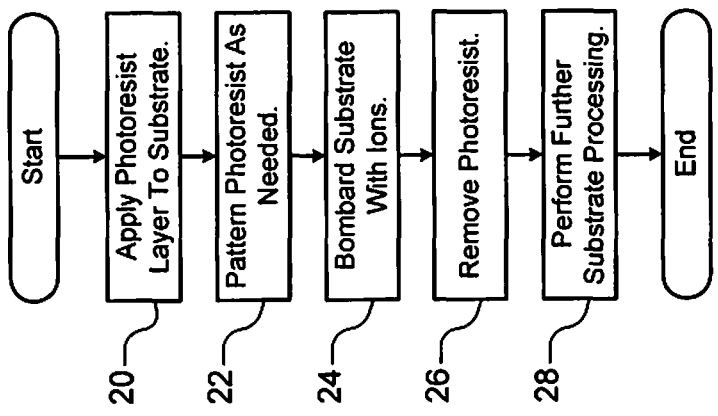
Figure 2:
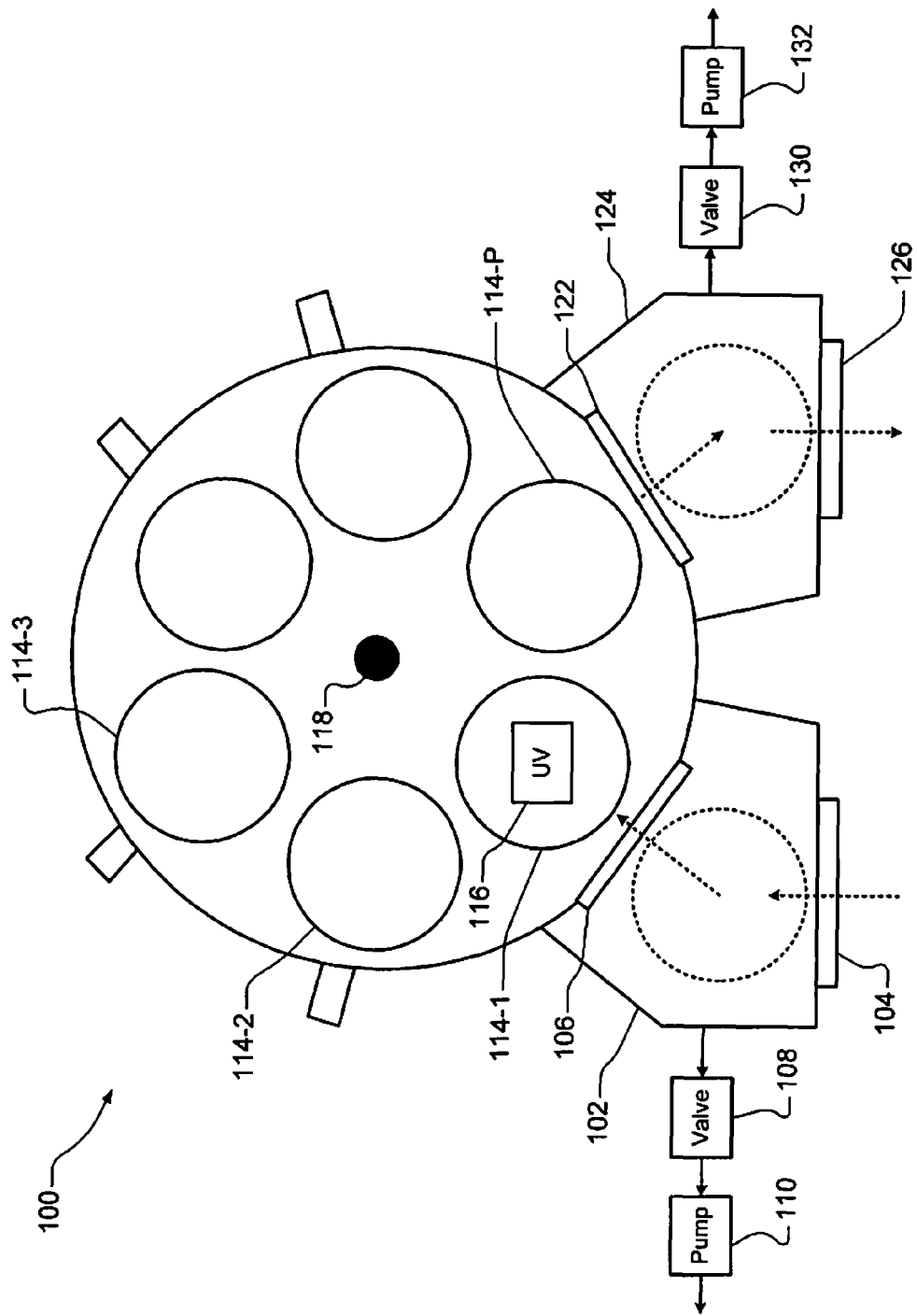
FIG. 2 is a functional block diagram illustrating an example of a multi-stage sequential processing tool including processing stations according to the present disclosure.

Referring now to FIG. 2, a functional block diagram illustrating an example of a substrate processing tool 100 is shown. The substrate processing tool 100 includes an input loadlock 102. Substrates are introduced into the input loadlock 102 through a port 104. After the substrate is located in the input loadlock 102, the port 104 and a port 106 are closed and a valve 108 and a pump 110 may be used to reduce pressure in the input loadlock 102 to substantially match a pressure in the substrate processing tool 100.

Thereafter, the port 106 may be opened and a robot or another device may be used to load the substrate into a first one of a plurality of processing stations 114-1, 114-2, . . . , and 114-P (collectively processing stations 114), where P is an integer greater than one. One or more of the processing stations 114 may process the substrates using plasma as will be described below. A first one of the processing stations 114-1 may be used to expose the substrate to ultraviolet (UV) light generated by a UV assembly 116. The substrate is exposed to the UV light after the substrate has been bombarded with ions and before the photoresist is removed. In some examples, the UV exposure occurs while purge gas is flowing. In some examples, the purge gas includes molecular nitrogen ($N_2$), molecular oxygen ($O_2$), helium (He), argon (Ar), ammonia ($NH_3$) combinations thereof, or other suitable purge gases. In other examples, the UV exposure occurs at vacuum. For example only, the UV exposure may occur at similar vacuum levels as the plasma stripping. In other examples, the UV exposure may occur at atmospheric pressure.

After the substrate has been exposed to the UV light, an indexing mechanism 118 may be used to index the substrate to a subsequent one of the processing stations 114 and another substrate may be loaded into the processing station 114-1. Exposure to plasma is performed in another one of the processing stations (such as 114-2). For example only, suitable plasma chemistry includes forming gas (FG), ammonia (NH$_3$), molecular oxygen (O$_2$), molecular nitrogen (N2), combinations thereof such as NH$_3$/O$_2$, O$_2$/FG, O$_2$/N$_2$ and/or other suitable plasma gas chemistry.

Other ones of the processing stations 114 may be used to perform additional processing of the substrate. After processing in the last one of the processing stations 114-P is performed, a robot or other device may be used to remove the substrate through a port 122 to an output loadlock 124. The port 122 is closed and a port 126 is opened to allow the substrate to be removed from the substrate processing tool 100. A valve 130 and pump 132 may be used to control pressure in the output loadlock 124. In other words, prior to opening the port 122, the pressure in the output loadlock 124 may be substantially equalized to the substrate processing tool 100.

In some examples, the UV assembly 116 outputs light having wavelengths between 172-245 nm, although other wavelength ranges may be used. In some examples, the processing station 114-1 cools the substrate during UV exposure by contacting the substrate with a temperature-controlled substrate support such as a pedestal, a cold plate or an electrostatic chuck. In some examples, the substrate may be kept below a thermal activation threshold for the deprotection reaction to commence. In some examples, the UV exposure is carried out at temperatures less than or equal to 75° C. or less than or equal to 50° C., although other temperature values may be used.

Figure 3:
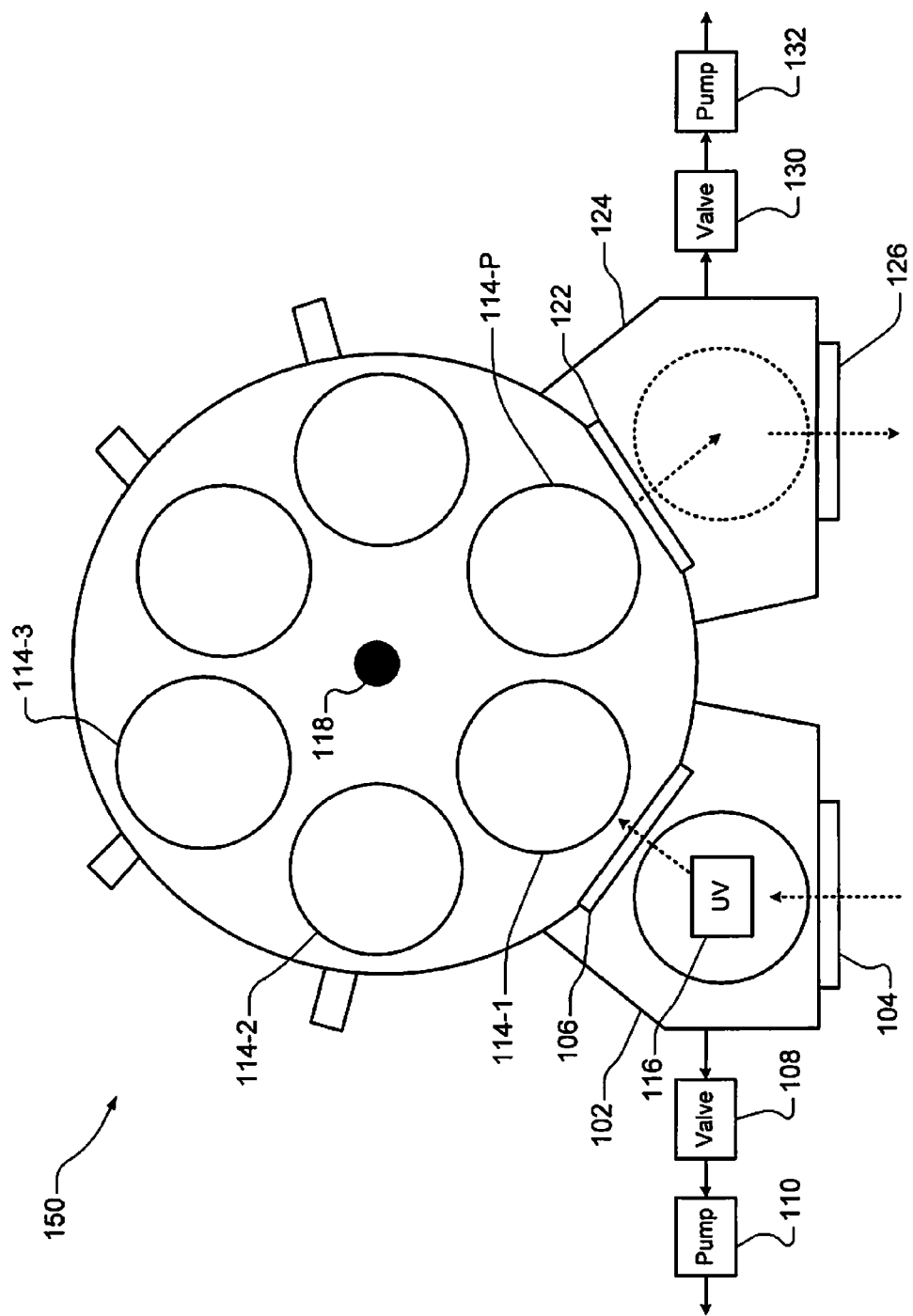
FIG. 3 is a functional block diagram illustrating another example of a multi-stage sequential processing tool including processing stations according to the present disclosure.

Referring now to FIG. 3, another example of a processing tool 150 is shown. In this example, the UV assembly 116 is positioned within the input loadlock 102. The substrate is exposed to UV light in the input loadlock 102 prior to entry into a plasma processing station. The exposure to UV light may occur before, during and/or after pressure equalization with the substrate processing tool 100.

Figure 4:
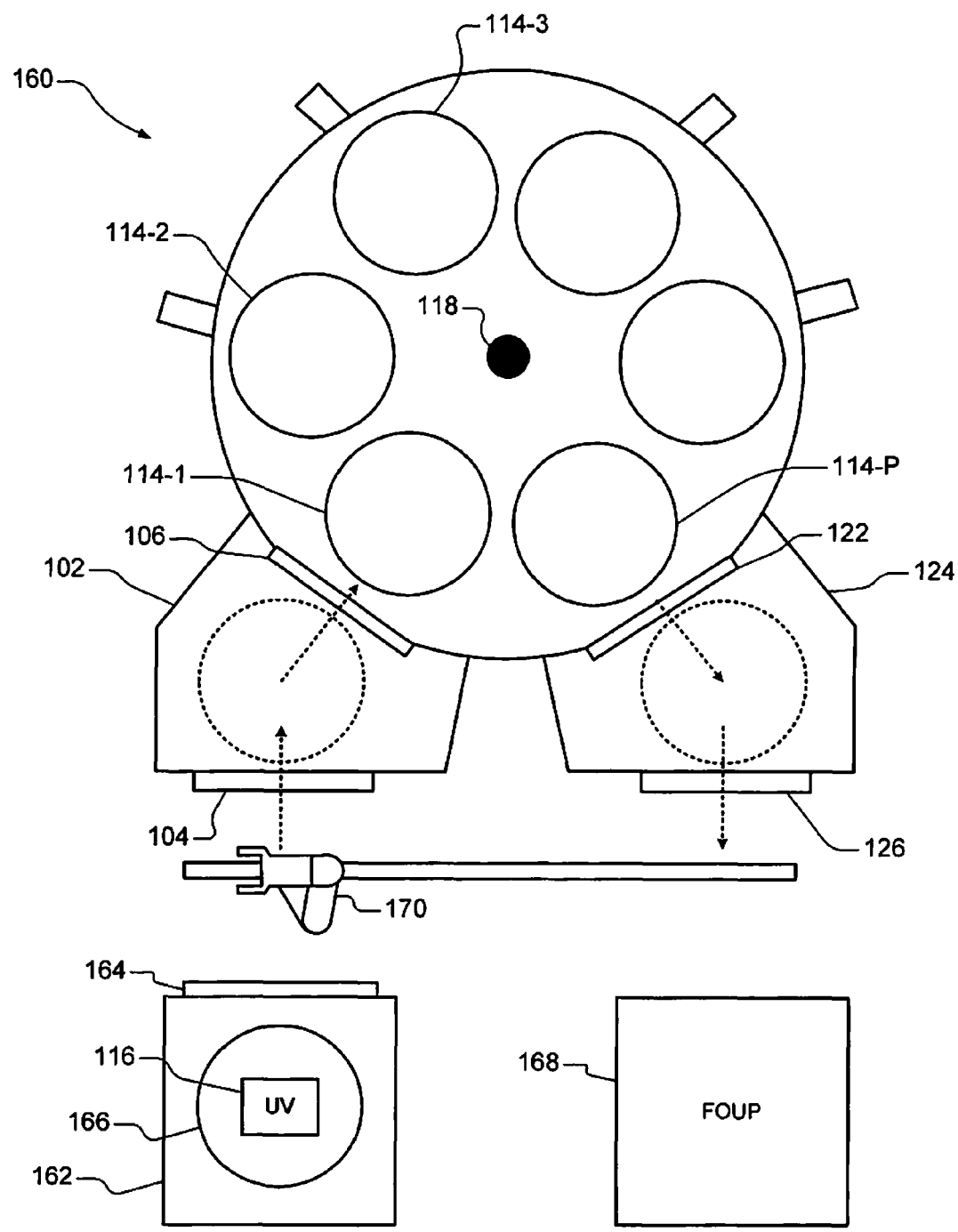
FIG. 4 is a functional block diagram illustrating another example of a multi-stage sequential processing tool including processing stations according to the present disclosure.

Referring now to FIG. 4, a functional block diagram illustrating another example of a substrate processing tool 160 is shown. Because exposure to UV light does not require vacuum, UV exposure station 162 provides an atmospheric mini-environment and exposes the substrate to UV light from the UV assembly 116. The UV exposure station 162 may include a port 164 and a substrate support such as a pedestal, plate or electrostatic chuck identified at 166. In this example, a robot 170 may be used to retrieve substrates from a front opening universal pod (FOUP) or other delivery device identified at 168. The robot 170 retrieves the substrate from the FOUP or other delivery device 168 and positions the substrate in the UV exposure station 162. The substrate is exposed to UV light generated by the UV assembly 116. Then, the robot 170 transfers the substrate to the substrate processing tool 160. At least one of the processing stations 114 performs the plasma strip.

Figure 5:
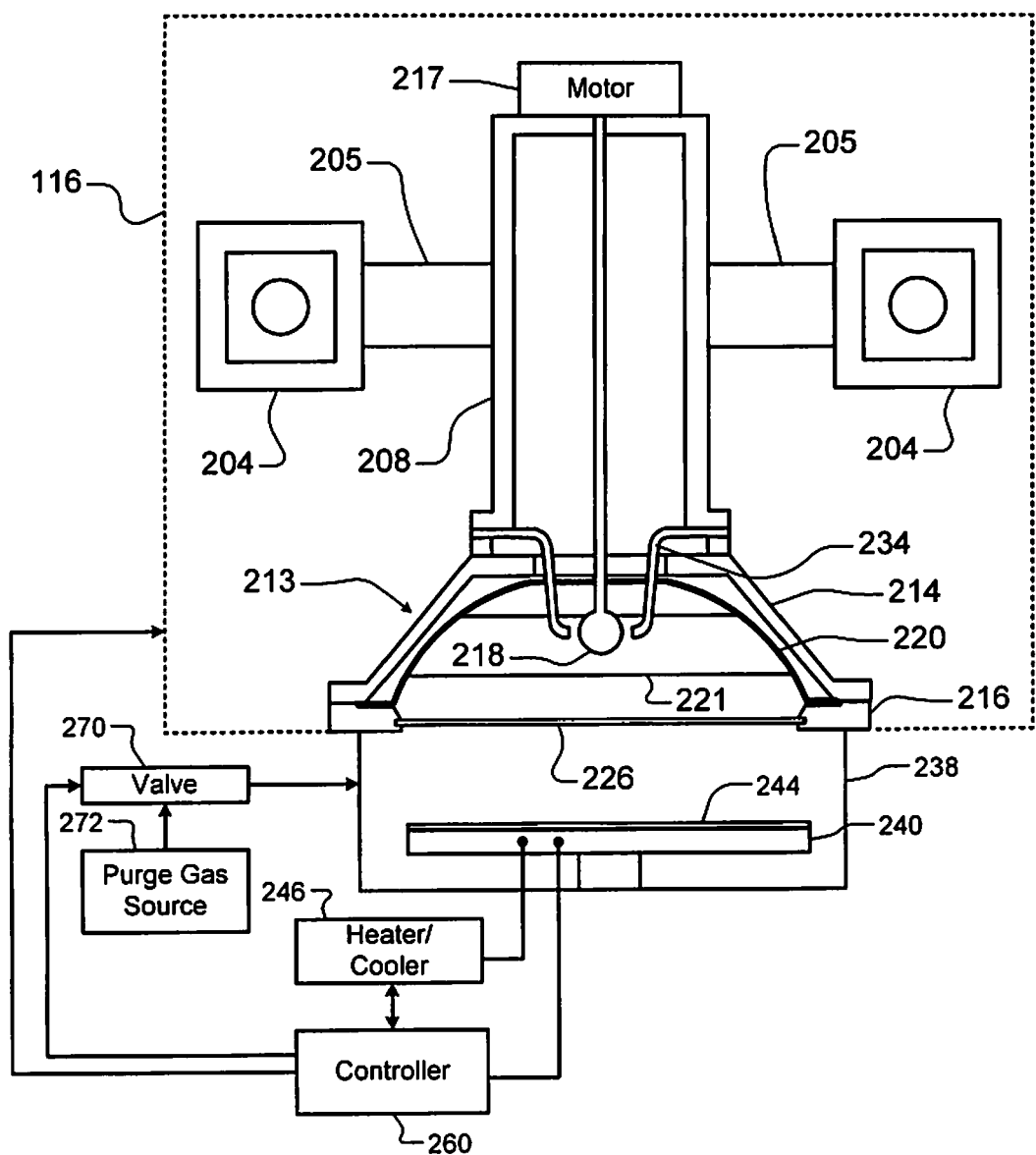
FIG. 5 is a cross-sectional view of an example of an ultraviolet (UV) assembly and processing station according to the present disclosure.

Referring now to FIG. 5, an example of a processing station including the UV assembly 116 is shown. The UV assembly 116 includes magnetrons 204, waveguides 205 and a resonant cavity 208. A housing 213 includes housing portions 214 and 216. A rotation motor 217 may be used to rotate a UV bulb 218 relative to the housing 213, the substrate or other portions of the UV assembly 116. In some examples, the UV bulb 218 is rotated during the UV treatment to increase uniformity of UV exposure.

A reflector 220 may include one or more facets 221 and is held in place by housing portions 214 and 216. The UV bulb 218 extends into a cavity defined by the reflector 220. A window 226 is arranged between the UV bulb 218 and the substrate. During operation, cooling jets 234 may be used to supply cooling gas to the UV bulb 218 to cool the UV bulb 218.

The UV assembly 116 is arranged on a top side of a processing station 238. A substrate support 240 such as a pedestal, cold plate, electrostatic chuck, etc. is arranged inside of the processing station 238. A heater and/or cooler 246 selectively heats and/or cools the substrate support 240 to maintain a predetermined temperature during UV exposure. In some examples, only cooling is performed. A controller 260 may be used to receive temperature feedback from the substrate support 240. For example, the controller 260 may be connected to a thermocouple (not shown). The controller may also be used to control supply of purge gas from a purge gas source 272 via a valve 270.

In use, the magnetrons 204 generate microwave energy. The microwave energy excites bulb fill in the UV bulb 218 to a plasma state. Direct and reflected energy is transmitted to the substrate 244. In some examples, the UV bulb 218 produces UV intensity of up to 400 mW/cm$^2$ and has a uniformity of less than 10%, where uniformity is defined as (max−min)/(max+min).

Figure 6:
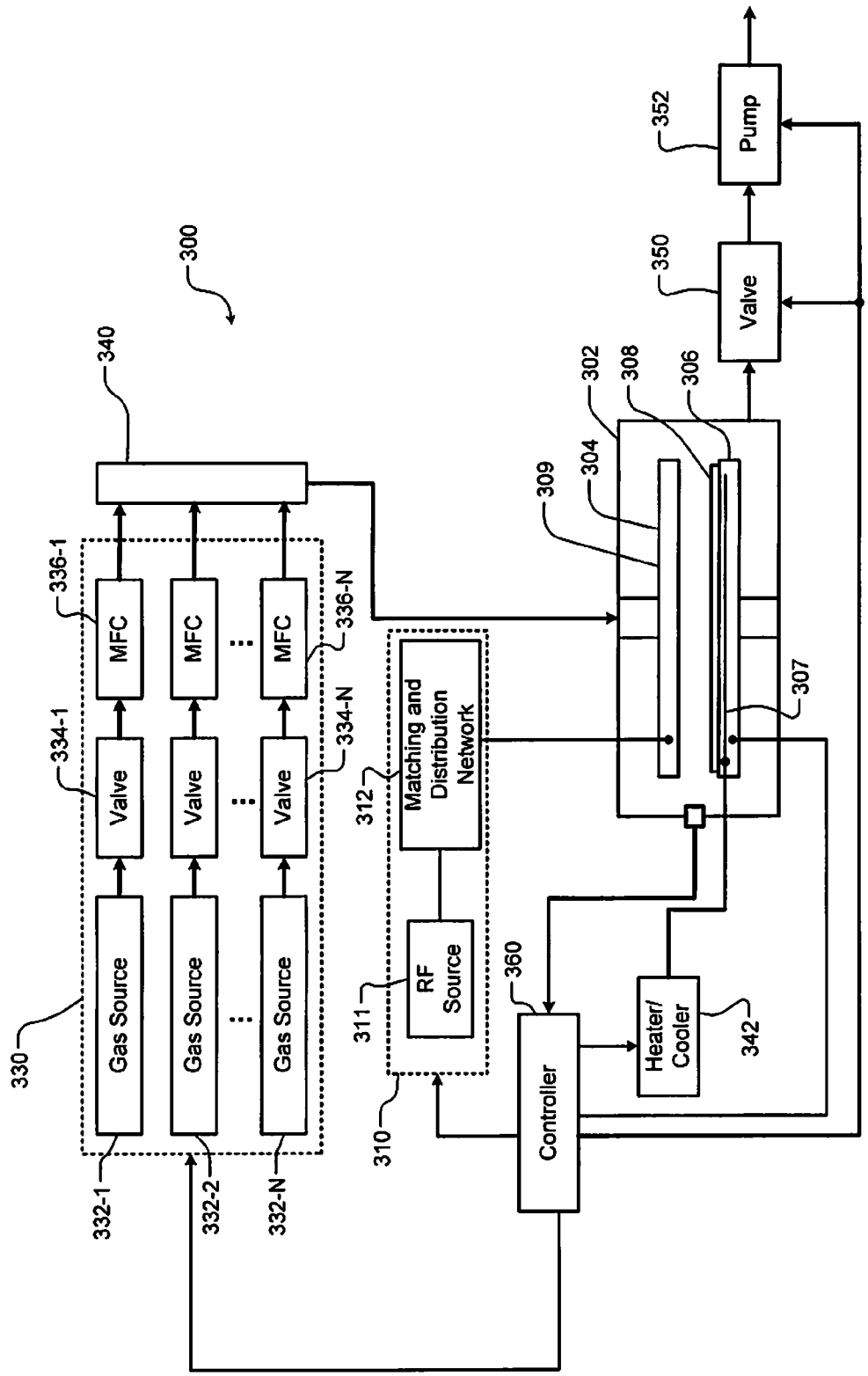
FIG. 6 is a functional block diagram of an example of a plasma processing station according to the present disclosure.

Referring now to FIG. 6, an example of a substrate processing system 300 for performing ashing, deposition or etching using plasma is shown. The substrate processing system 300 includes a processing station 302 that encloses other components of the substrate processing system 300 and contains the plasma. The substrate processing system 300 includes an upper electrode 304 and a substrate support 306 (such as a pedestal, electrostatic chuck, plate, etc) including a lower electrode 307. A substrate 308 is arranged on the substrate support 306 between the upper electrode 304 and the lower electrode 307. The substrate support 306 is heated and cooled as needed.

For example only, the upper electrode 304 may include a showerhead 309 that introduces and distributes process gases. Alternately, the upper electrode 304 may include a conducting plate and the process gases may be introduced in another manner. The lower electrode 307 may include a grounded coil such as a heater coil that is arranged in a non-conductive pedestal. Alternately, the substrate support 306 may include an electrostatic chuck that includes a conductive plate that acts as the lower electrode 307.

An RF generator 310 generates and outputs an RF signal to one of the upper electrode 304 and the lower electrode 307. The other one of the upper electrode 304 and the lower electrode 307 may be grounded or floating. For example only, the RF generator 310 may include an RF source 311 that generates the RF signal that is fed by a matching and distribution network 312 to the upper electrode 304 or the lower electrode 307.

An example of a gas delivery system 330 is shown in FIG. 6. The gas delivery system 330 includes one or more gas sources 332-1, 332-2, . . . , and 332-N (collectively gas sources 332), where N is an integer greater than zero. The gas sources supply process gases, inert gases, precursors and mixtures thereof. Vaporized precursor may also be used. The gas sources 332 are connected by valves 334-1, 334-2, . . . , and 334-N (collectively valves 334) and mass flow controllers 336-1, 336-2, . . . , and 336-N (collectively mass flow controllers 336) to a manifold 340. An output of the manifold 340 is fed to the processing station 302. For example only, the output of the manifold 340 is fed to the showerhead 309.

A heater and/or cooler 342 selectively heats and/or cools the substrate support 306 to maintain a predetermined temperature during photoresist strip. A controller 360 may be used to control components of the substrate processing system 300. The controller 360 may be used to receive temperature feedback from the substrate support 306. For example, the controller 360 may be connected to a thermocouple (not shown). The controller 360 may also be used to control the process. For example, the controller 360 may send the plasma on/off signals to the RF generator 310. The controller 360 may also be used to control supply of gas from the gas delivery system 330. The controller 360 may also control a valve 350 and pump 352, which may be used to evacuate reactants from the processing station 302.

Figure 7C:
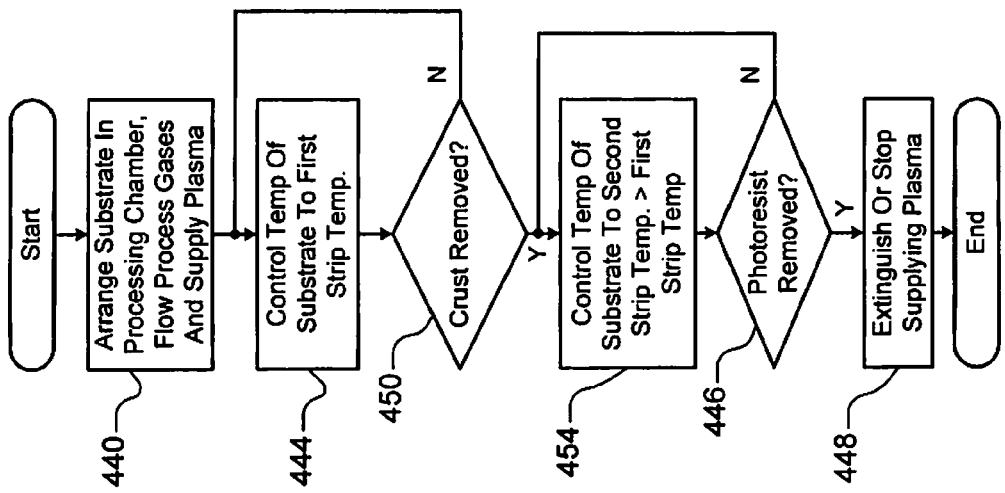
FIG. 7A-7C are flowcharts illustrating examples of a method for processing a substrate using a photoresist layer and ion bombardment and methods for stripping the photoresist according to the present disclosure.
Figure 7B:
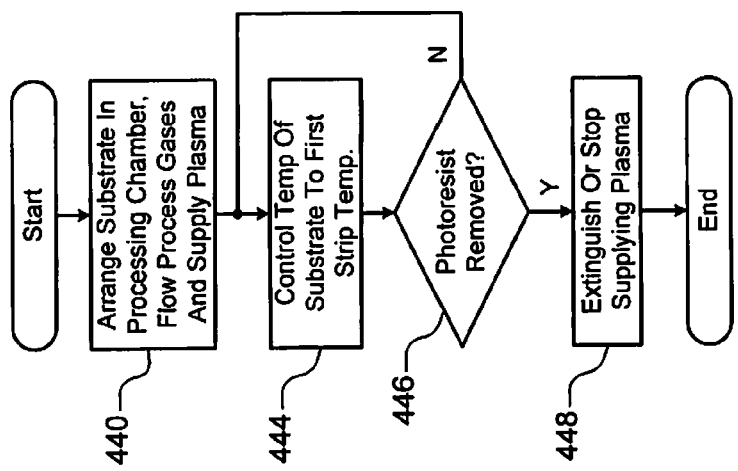
Figure 7A:
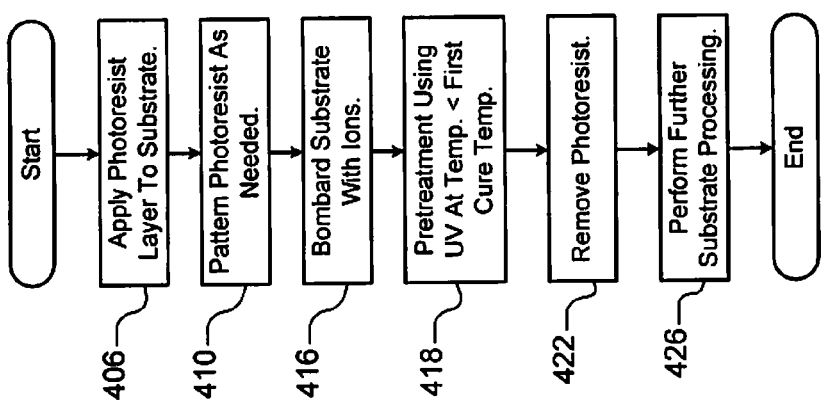

Referring now to FIGS. 7A-7C, examples of a method for processing a substrate using photoresist and ion bombardment and methods for stripping the photoresist are shown.

In FIG. 7A at 406, a photoresist layer is applied to a substrate, for example using spin coating or other suitable methods. At 410, the photoresist is patterned into masked and unmasked regions. At 416, the substrate is bombarded with ions. The ions are implanted into the substrate in the unmasked regions. The masked regions of the substrate block the ions. At 418, the substrate is exposed to UV light during a UV pretreatment prior to photoresist removal. In some examples, the UV pretreatment is performed at a temperature that is less than a predetermined temperature. In some examples, the predetermined temperature is less than a thermal activation threshold for the deprotection reaction to commence. In some examples, the predetermined temperature is less than or equal to 75° C. and in other examples the predetermined temperature is less than or equal to 50° C., although other predetermined temperature values may be used. During subsequent processing, the photoresist is removed at 422. At 426, further processing of the substrate is performed.

In FIG. 7B, steps that are performed to remove the photoresist are shown. At 440, the substrate is arranged in a processing station, process gases are supplied and plasma is supplied or struck. At 444, a temperature of the substrate is cooled to a predetermined temperature that is less than a strip process temperature. The strip process temperature may be a temperature that is less than a popping temperature of the substrate after UV exposure described herein. If the photoresist is not removed at 446, control returns to 444. If the photoresist is removed at 446, control continues with 448 and extinguishes or stops supplying the plasma. The determination of whether or not the photoresist is removed may be made based on predetermined strip periods that are determined using test substrates or using other methods.

In FIG. 7C, in some examples the strip process temperature may be increased once the photoresist crust layer is removed. If the photoresist crust layer is not removed as determined at 450, then control returns to 444. If the photoresist crust layer is removed as determined at 450, then control continues at 454 and sets the temperature of the substrate to a second strip process temperature that is higher than the first strip process temperature. If the photoresist layer is not removed at 446 in FIG. 7C, control returns to 454. If the photoresist layer is removed at 446 in FIG. 7C, control continues with 448 and extinguishes the plasma. The determination of whether or not the photoresist crust layer or the photoresist layer is removed may be made based on predetermined strip periods that are determined using test substrates or using other methods.

Figure 8:
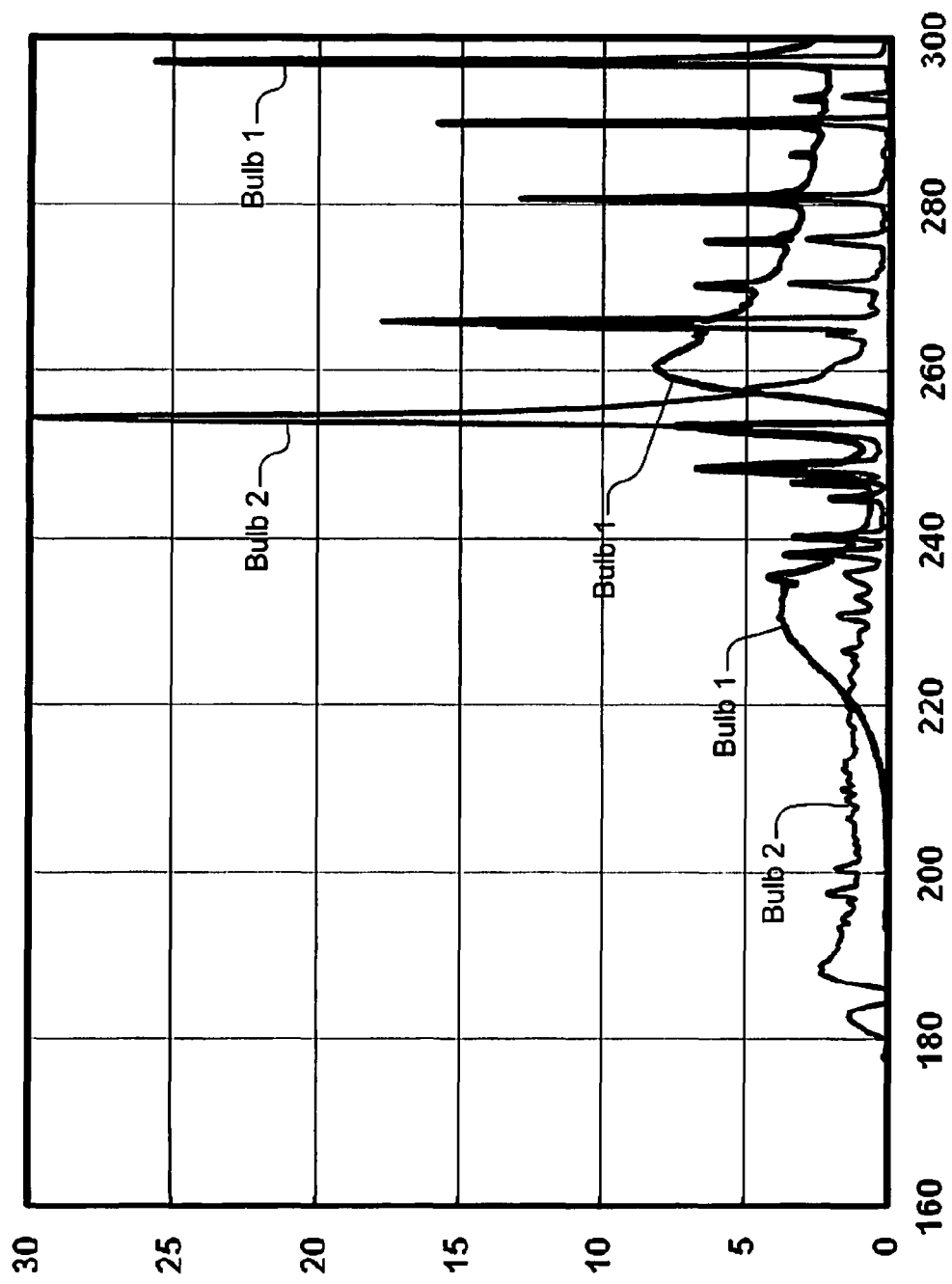
FIG. 8 illustrates intensity as a function of wavelength for example UV bulbs.

Referring now to FIG. 8, examples of UV intensity as a function of wavelength is shown for several UV light sources (Bulb1 and Bulb2). In one example, a 1.2 μm deep UV (DUV) photoresist was implanted with $5 \times 10^{15}$ ions/cm$^2$ of As at 20 keV. Examples of cure times, UV bulb wavelengths, energy, UV exposure time and UV exposure temperature are provided below in Table I:

TABLE I

| Bulb | Cure Temp | Cure Time | Popping Temp ° C. | Strip Temperature[1] ° C. | TTC, s |
|---|---|---|---|---|---|
| No UV | — | — | 162 | 142 | 400 |
| Bulb 1 | 50 | 30 | 187 | 167 | 260 |
| Bulb 2 | 50 | 30 | 225 | 205 | 195 |
| Bulb 2 | Ramp to 160 | 30 | 195 | — | — |
| Bulb 2 | 50 | 5[2] | 230 | 210 | 174 |
| Bulb 1 with "micro-popping" | 50 | 30 | 187 | 285 | 125 |

[1]Strip process temperature set to popping temperature less 20° C.
[2]Reduced cure time increased popping temperature due to decreased wafer heating.

As can be appreciated, performing the UV pretreatment after ion bombardment and prior to photoresist removal raises a popping temperature of the substrate relative to substrates that are not treated. As a result, the temperature used during the subsequent photoresist removal can be higher while defects are reduced. In some examples, the temperature used during the photoresist removal is higher than an untreated popping temperature of the substrate and lower than a UV treated popping temperature of the substrate. In some examples, the temperature of the photoresist removal is 10-40° C. less than the treated popping temperature of the substrate. In some examples, the temperature of the photoresist removal is about 20° C. less than the treated popping temperature of the substrate.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term controller may be replaced with the term circuit. The term controller may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple controllers. The term group processor encompasses a processor that, in combination with additional processors, executes some or all code from one or more controllers. The term shared memory encompasses a single memory that stores some or all code from multiple controllers. The term group memory encompasses a memory that, in combination with additional memories, stores some or all code from one or more controllers. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A method for processing a substrate, comprising:
   (a) forming a photoresist layer over an outer surface of a substrate;
   (b) patterning the photoresist layer to create (i) unmasked regions where the photoresist layer does not cover the outer surface of the substrate and (ii) masked regions where the photoresist layer covers the outer surface of the substrate;
   after (b), (c) bombarding the substrate and the photoresist layer with ions;
   after (c), (d) exposing the substrate to ultraviolet (UV) light from a UV light source having a predetermined wavelength range;
   (e) controlling the temperature of the substrate, while exposing the substrate and the photoresist to the UV light, to less than or equal to a first temperature; and
   (f) after exposing the substrate to the UV light:
      (i) removing a crust layer of the photoresist layer using plasma while maintaining the temperature of the substrate to less than or equal to a first strip process temperature; and
      (ii) removing a remainder of the photoresist layer using plasma while maintaining the temperature of the substrate above the first strip process temperature and less than or equal to a second strip process temperature,
   wherein the first temperature is less than the first and second strip process temperatures.

2. The method of claim 1, wherein the first temperature is less than or equal to a thermal activation threshold for initiating a deprotection reaction.

3. The method of claim 2, wherein the first temperature is less than or equal to 75° C.

4. The method of claim 3, wherein the first temperature is less than or equal to 50° C.

5. The method of claim 1, wherein the substrate has an untreated popping temperature before exposing the substrate to the UV light, wherein the substrate has a UV-treated popping temperature after exposing the substrate to the UV light, and wherein the UV-treated popping temperature is greater than the untreated popping temperature.

6. The method of claim 5, wherein the first strip process temperature is set greater than or equal to the untreated popping temperature and less than or equal to the UV-treated popping temperature.

7. The method of claim 5, wherein the first strip process temperature is greater than or equal to the untreated popping temperature and 10 to 40° C. less than the UV-treated popping temperature.

8. The method of claim 1, wherein the predetermined wavelength range is between 172-245 nm.

9. The method of claim 1, wherein dosing of the ions in the substrate is greater than about $1\times10^{15}$ ions/cm$^2$.

10. The method of claim 1, further comprising flowing purge gas while exposing the substrate to the UV light.

11. A method for processing a substrate, comprising:
   (a) forming a photoresist layer over an outer surface of a substrate;
   (b) patterning the photoresist layer to create (i) unmasked regions where the photoresist layer does not cover the outer surface of the substrate and (ii) masked regions where the photoresist layer covers the outer surface of the substrate;
   after (b), (c) bombarding the substrate and the photoresist layer with ions,
      wherein the ion bombardment generates photoacids in the photoresist layer;
   after (c), (d) exposing the substrate to ultraviolet (UV) light from a UV light source having a predetermined wavelength range;
   (e) cooling the substrate, while exposing the substrate and the photoresist to the UV light, to a temperature less than a first temperature where a deprotection reaction begins; and
   (f) after exposing the substrate to the UV light, removing the photoresist layer using plasma while maintaining the temperature of the substrate to less than or equal to a strip process temperature,
   wherein the first temperature is less than the strip process temperature.

* * * * *